(12) United States Patent
Omuro et al.

(10) Patent No.: US 11,310,908 B2
(45) Date of Patent: Apr. 19, 2022

(54) CIRCUIT BOARD, INDUCTOR, AND RADIO APPARATUS

(71) Applicant: Murata Manufacturing Co., Ltd., Kyoto-fu (JP)

(72) Inventors: Masashi Omuro, Nagaokakyo (JP); Yu Ishiwata, Nagaokakyo (JP); Yasuhisa Yamamoto, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 16/902,062

(22) Filed: Jun. 15, 2020

(65) Prior Publication Data
US 2020/0396828 A1 Dec. 17, 2020

(30) Foreign Application Priority Data
Jun. 17, 2019 (JP) .............................. JP2019-111939

(51) Int. Cl.
*H05K 1/16* (2006.01)
*H05K 1/02* (2006.01)
*H05K 1/11* (2006.01)

(52) U.S. Cl.
CPC ............. *H05K 1/0243* (2013.01); *H05K 1/11* (2013.01); *H05K 2201/09218* (2013.01); *H05K 2201/1003* (2013.01)

(58) Field of Classification Search
CPC ........ H05K 1/16; H05K 1/165; H05K 1/0243; H05K 1/11; H05K 2201/086; H05K 2201/1003
See application file for complete search history.

(56) References Cited

U.S. PATENT DOCUMENTS

| 2006/0139131 | A1 | 6/2006 | Asano | |
| 2007/0085649 | A1* | 4/2007 | Park | H01L 23/5227 336/200 |
| 2013/0068515 | A1* | 3/2013 | Toyao | H05K 1/0236 174/260 |
| 2016/0234979 | A1* | 8/2016 | Lee | H05K 9/0026 |
| 2016/0276733 | A1* | 9/2016 | Kasahara | H01Q 19/005 |
| 2017/0245359 | A1* | 8/2017 | Mu | H05K 1/025 |
| 2018/0082930 | A1* | 3/2018 | Khoo | H01L 23/4952 |

FOREIGN PATENT DOCUMENTS

| JP | S61-039606 A | 2/1986 |
| JP | 05-041221 U | 6/1993 |
| JP | 2006-185936 A | 7/2006 |
| JP | 2006-222675 A | 8/2006 |
| KR | 10-2013-0075978 A | 7/2013 |

OTHER PUBLICATIONS

An Office Action mailed by the Korean Intellectual Property Office dated May 12, 2021, which corresponds to Korean Patent Application No. 10-2020-0071655 and is related to U.S. Appl. No. 16/902,062 with English language translation.

* cited by examiner

*Primary Examiner* — Hoa C Nguyen
(74) *Attorney, Agent, or Firm* — Studebaker & Brackett PC

(57) ABSTRACT

A power supply circuit board includes a substrate, a first line that is provided on a first main surface of the substrate and that has a land, a second line that is provided on the first main surface of the substrate and that has a land, an inductor that is connected to the land of the first line and the land of the second line and that is made of a ferrite material, and an open stub that is connected to at least one of the first line and the second line.

9 Claims, 12 Drawing Sheets

CIRCUIT BOARD, INDUCTOR, AND RADIO APPARATUS

CROSS-REFERENCE TO RELATED APPLICATION

This application claims benefit of priority to Japanese Patent Application No. 2019-111939, filed Jun. 17, 2019, the entire content of which is incorporated herein by reference.

BACKGROUND

Technical Field

The present disclosure relates to a circuit board, an inductor, and a radio apparatus.

Background Art

Japanese Unexamined Patent Application Publication No. 2006-222675 discloses an disclosure to suppress unnecessary radiation noise from an integrated circuit (IC) including a quartz oscillator by using ferrite beads.

Measures against noise in a broad band from a band of less than about 1 GHz to a band of not less than about 1 GHz are required in fourth generation (4G) communication and fifth generation (5G) communication in recent years. However, there is a problem in that, with the common ferrite beads used in the circuit described in Japanese Unexamined Patent Application Publication No. 2006-222675, only the noise in the band of less than about 1 GHz is capable of being attenuated and the noise in higher frequency bands are not capable of being attenuated.

SUMMARY

Accordingly, the present disclosure provides a circuit board, an inductor, and a radio apparatus capable of attenuating noise in a broad band from a band of less than about 1 GHz to a band of not less than about 1 GHz.

A circuit board according to an embodiment of the present disclosure includes a substrate, a first line that is provided on a first main surface of the substrate and that has a land, a second line that is provided on the first main surface of the substrate and that has a land, an inductor that is connected to the land of the first line and the land of the second line and that is made of a ferrite material, and an open stub that is connected to at least one of the first line and the second line.

An inductor according to an embodiment of the present disclosure includes a main body made of a ferrite material, a line provided in the main body, a first outer electrode that is provided on the main body and that is connected to a first end portion of the line, a second outer electrode that is provided on the main body and that is connected to a second end portion of the line, and an open stub that is positioned in the main body and that is connected to the line.

According to the present disclosure, it is possible to attenuate noise in a broad band from a band of less than about 1 GHz to a band of not less than about 1 GHz.

Other features, elements, characteristics and advantages of the present disclosure will become more apparent from the following detailed description of preferred embodiments of the present disclosure with reference to the attached drawings.

DETAILED DESCRIPTION

Circuit boards, inductors, and a radio apparatus according to embodiments of the present disclosure will herein be described in detail with reference to the drawings.

Figure 1:
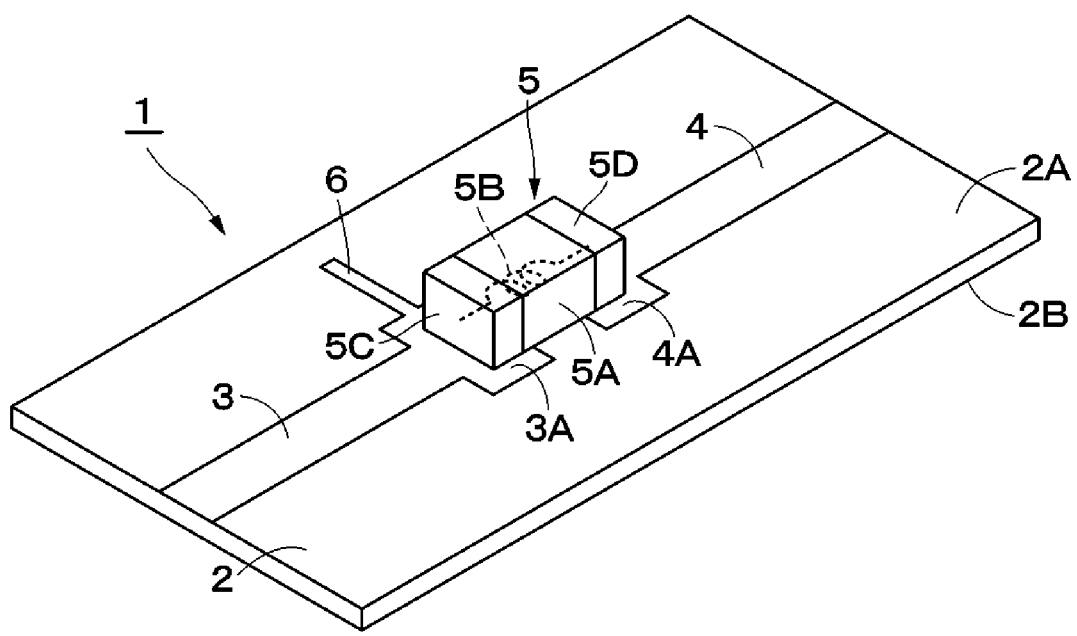
FIG. 1 is a perspective view illustrating a power supply circuit board according to a first embodiment of the present disclosure.
Figure 2:
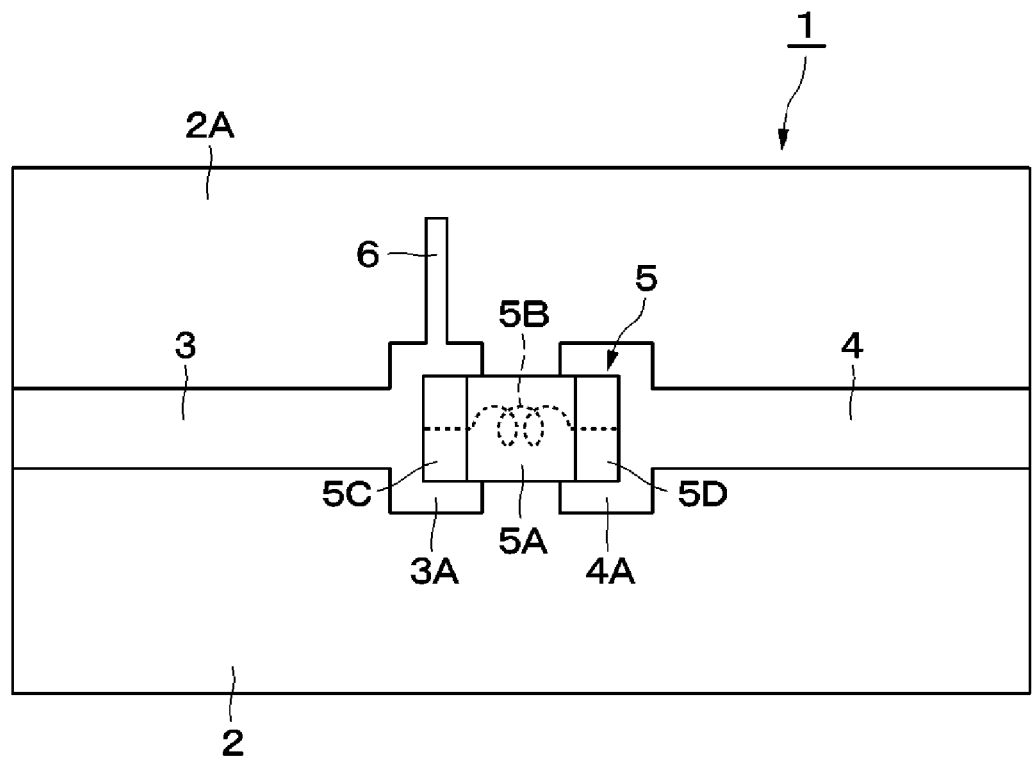
FIG. 2 is a plan view illustrating the power supply circuit board in FIG. 1.

FIG. 1 and FIG. 2 illustrate a power supply circuit board 1, which is a circuit board according to a first embodiment of the present disclosure. The power supply circuit board 1 includes a substrate 2, a first line 3, a second line 4, an inductor 5, and an open stub 6.

The substrate 2 is a flexible substrate (flexible printed circuit board) that is made of an insulating material, such as a resin material, and that is formed in a substantially planar shape. The substrate 2 has a first main surface 2A (an upper surface) and a second main surface 2B (a lower surface), which are opposed to each other. The substrate 2 may be a single-layer substrate formed of a single insulating layer or may be a multilayer substrate in which multiple insulating layers are laminated. The substrate 2 is not limited to the flexible substrate and may be a rigid substrate. The substrate 2 is not limitedly made of the resin material and may be made of, for example, a ceramic material, glass, or liquid crystal polymer.

The first line 3 is formed on the first main surface 2A of the substrate 2. The first line 3 is formed of a substantially strip-shaped wiring pattern made of a conductive material, such as a metal material. The first line 3 has a land 3A. The land 3A is positioned at an end portion of the first line 3 and is formed in, for example, a substantially quadrangular shape. The first line 3 and the second line 4 are power lines that supply electric power to various high-frequency driving circuits.

The second line 4 is configured in approximately the same manner as in the first line 3. The second line 4 is formed on the first main surface 2A of the substrate 2. The second line 4 is formed of a substantially strip-shaped wiring pattern made of a conductive material. The second line 4 has a land 4A. The land 4A is positioned at an end portion of the second line 4 and is formed in, for example, a substantially quadrangular shape. The land 4A of the second line 4 is arranged near the land 3A of the first line 3. A gap is formed between the land 4A of the second line 4 and the land 3A of the first line 3.

The inductor 5 is made of a ferrite material. Specifically, the inductor 5 includes a main body 5A made of the ferrite material, a line 5B provided in the main body 5A, a first outer electrode 5C that is provided on the main body 5A and that is connected to a first end portion of the line 5B, and a second outer electrode 5D that is provided on the main body 5A and that is connected to a second end portion of the line 5B. The main body 5A is formed in, for example, a substantially rectangular parallelepiped shape. The first outer electrode 5C is arranged at the first end portion side in the length direction of the main body 5A. The first outer electrode 5C is joined to the land 3A of the first line 3 with joining means, such as solder. The second outer electrode 5D is arranged at the second end portion side in the length direction of the main body 5A. The second outer electrode 5D is joined to the land 4A of the second line 4 with joining means, such as solder. The inductor 5 functions as ferrite beads and is equivalent to resistance in a high-frequency domain. However, the resistance value (impedance value) of the inductor 5 is decreased in a frequency band higher than about 1 GHz. Accordingly, the inductor 5 attenuates, for example, components of not higher than about 1 GHz in high-frequency noise flowing through the line 5B.

The open stub 6 is connected to the land 3A of the first line 3. The open stub 6 is formed on the first main surface 2A of the substrate 2. The open stub 6 is formed of a substantially linear-shape wiring pattern. A first end of the open stub 6 is connected to the land 3A. A second end (an end edge) of the open stub 6 is opened. The length dimension of the open stub 6 is set so that the electrical length of the open stub 6 has a value, for example, ¼ of the wavelength of about 2.4 GHz, which is in a radio frequency band. Accordingly, the open stub 6 attenuates the noise in a frequency band around about 2.4 GHz. At this time, the attenuation band of the open stub 6 is higher than the attenuation band of the inductor 5. As a result, the power supply circuit board 1 is capable of attenuating the noise in a broad band from a band of less than about 1 GHz to a band of not less than about 1 GHz.

Figure 3:
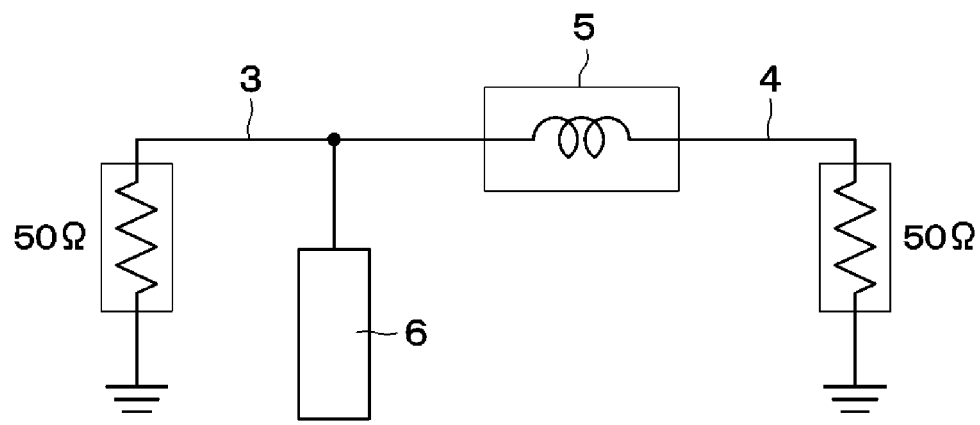
FIG. 3 is an equivalent circuit diagram illustrating the power supply circuit board according to the first embodiment.
Figure 4:
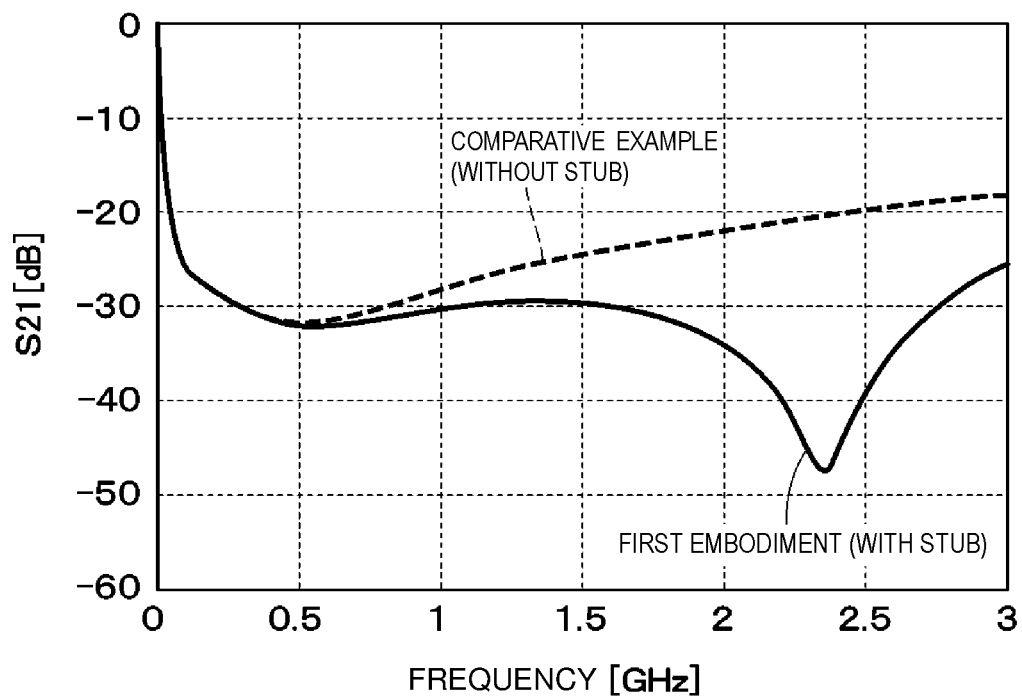
FIG. 4 is a graph indicating frequency characteristics of a transmission coefficient for the power supply circuit board according to the first embodiment and a power supply circuit board according to a comparative example.

In order to confirm the attenuation effect of the noise by the open stub 6, frequency characteristics of S21 (transmission coefficient) of a Scattering (S) parameter were calculated through simulation for a power supply circuit board of a comparative example without the open stub 6 and the power supply circuit board 1 according to the first embodiment with the open stub 6 based on an equivalent circuit illustrated in FIG. 3. An example of the result of the simulation is illustrated in FIG. 4. In the simulation, the relative permittivity of the substrate 2 was set to about 4.5, the thickness dimension of the substrate 2 was set to about 40 μm, the thickness dimension of the first line 3 and the second line 4 was set to about 20 μm, and the dielectric loss tangent was set to about 0.018. The length dimension of the open stub 6 was set to about 18 mm and the width dimension of the open stub 6 was set to about 55 μm.

As illustrated in FIG. 4, in the comparative example, the attenuation of the noise was about −30 dB in the band of less than about 1 GHz. However, in the comparative example, the attenuation of the noise was decreased with the increasing frequency in the band of not less than about 1 GHz.

In contrast, in the first embodiment, the attenuation of the noise was about −30 dB in the band of less than about 1 GHz, as in the comparative example. In addition, in the first embodiment, the attenuation of the noise was greater than that of the comparative example in the band of not less than about 1 GHz. In particular, the attenuation of the noise was maximized near about 2.4 GHz. Accordingly, even when the noise near about 2.4 GHz, which is in the radio frequency band, is mixed into the first line 3 and the second line 4 for power supply, the noise is capable of being attenuated with the open stub 6. As a result, the power supply circuit board 1 according to the first embodiment is capable of attenuating the noise from the band of less than about 1 GHz to the band of not less than about 1 GHz.

As described above, the power supply circuit board 1 according to the first embodiment includes the inductor 5 connected to the land 3A of the first line 3 and the land 4A of the second line 4 and the open stub 6 connected to the land 3A of the first line 3. Accordingly, when the noise is transmitted to the first line 3 and the second line 4, the noise in the band of less than about 1 GHz is capable of being attenuated with transmission loss in the inductor 5. In addition, the noise in the band of not less than about 1 GHz is capable of being attenuated with the open stub 6. Consequently, the power supply circuit board 1 is capable of attenuating the noise in the broad band from the band of less than about 1 GHz to the band of not less than about 1 GHz.

The open stub 6 is formed of the substantially linear-shape wiring pattern. Accordingly, adjusting the length dimension of the open stub 6 enables the center frequency of the attenuation band of the noise with the open stub 6 to be set to a desired value.

The inductor 5 is capable of attenuating the noise in a band not higher than about 1 GHz. However, the attenuation effect of the noise with the inductor 5 tends to be reduced in the band of not less than about 1 GHz.

In consideration of this point, the attenuation band of the open stub 6 is made higher than that of the inductor 5 in the first embodiment. Accordingly, the noise in the band not higher than about 1 GHz is capable of being attenuated with the inductor 5. In addition, the noise in the band of not less than about 1 GHz is capable of being attenuated with the open stub 6. As a result, the power supply circuit board 1 according to the first embodiment is capable of attenuating the noise in the broad band.

The open stub 6 may not necessarily have the substantially linear shape. Accordingly, the open stub 6 may have a substantially curved shape, a substantially bent shape, a substantially folded shape, or a meander pattern.

Figure 5:
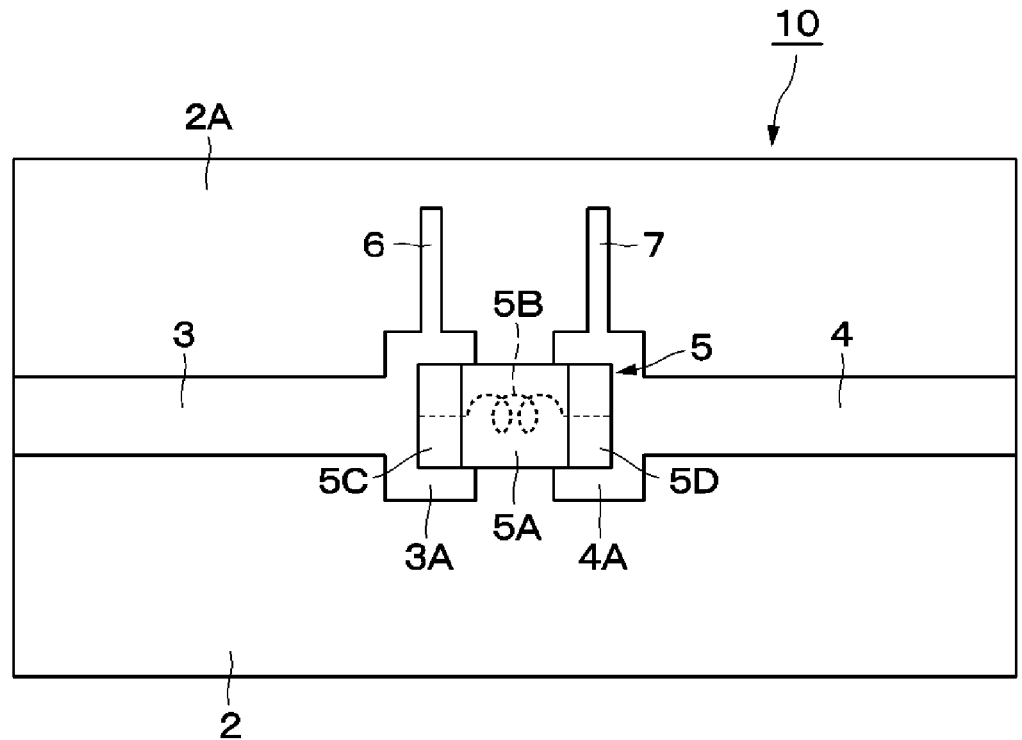
FIG. 5 is a plan view illustrating a power supply circuit board according to a modification of the present disclosure.

In the first embodiment, the open stub 6 is connected to the land 3A of the first line 3. The present disclosure is not limited to this and the open stub may be connected to the land 4A of the second line 4. In addition, the single open stub may not necessarily be provided. Accordingly, as in a modification illustrated in FIG. 5, a power supply circuit board 10 may include both the open stub 6 connected to the land 3A of the first line 3 and an open stub 7 connected to the land 4A of the second line 4. The open stub 6 may not necessarily be connected to the land 3A of the first line 3. The open stub 6 may be connected to a portion other than the land 3A of the first line 3 or may be connected to a portion other than the land 4A of the second line 4.

The center frequency of the attenuation band with the open stub 6 is not limited to about 2.4 GHz. It is sufficient for the center frequency of the attenuation band with the open stub 6 to be a frequency higher than the attenuation band of the inductor 5. Accordingly, the center frequency of the attenuation band with the open stub 6 may be a frequency lower than about 2.4 GHz or may be a frequency higher than about 2.4 GHz. The center frequency of the attenuation band with the open stub 6 may be a frequency in a millimeter-wave band higher than about 2.4 GHz as long as the electrical length has a value ¼ of the wavelength.

A second embodiment of the present disclosure will now be described with reference to FIG. 6. The second embodiment is characterized in that an open stub is formed of a substantially fan-shaped wiring pattern. The same reference numerals are used in the second embodiment to identify the same components as those in the first embodiment and a description of such components is omitted herein.

Figure 6:
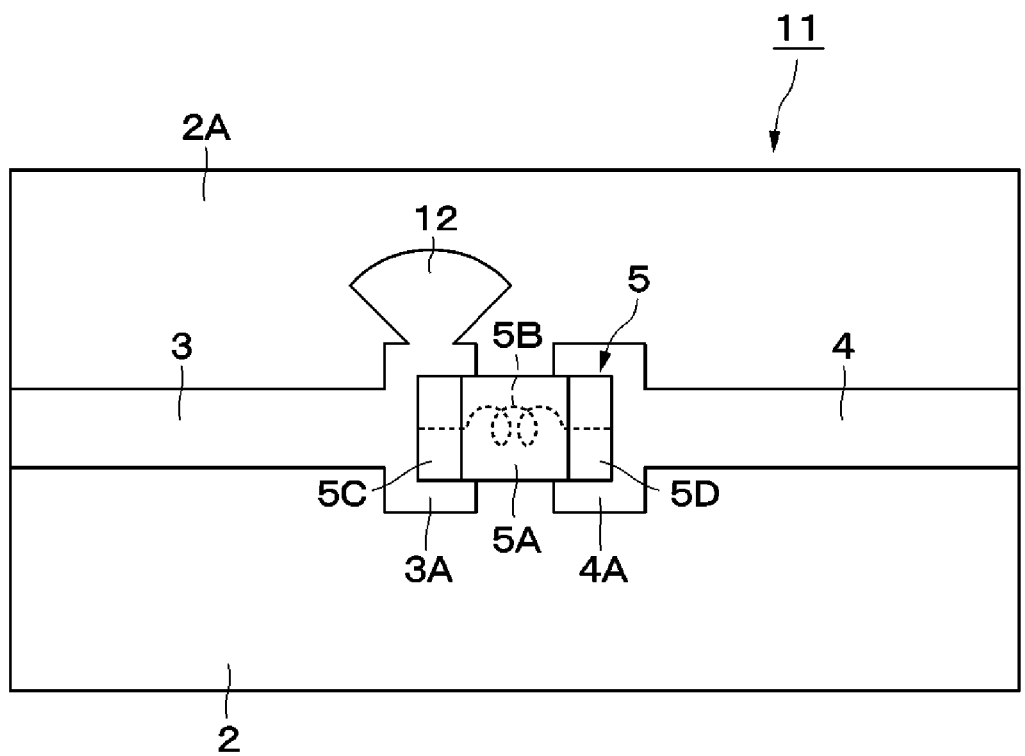
FIG. 6 is a plan view illustrating a power supply circuit board according to a second embodiment of the present disclosure.

FIG. 6 illustrates a power supply circuit board 11 according to the second embodiment of the present disclosure. The power supply circuit board 11 includes the substrate 2, the first line 3, the second line 4, the inductor 5, and an open stub 12.

The open stub 12 is connected to the land 3A of the first line 3. The open stub 12 is formed on the first main surface 2A of the substrate 2. The open stub 12 is formed of the substantially fan-shaped wiring pattern. The first end of the open stub 12 is the pivot of the fan and is connected to the land 3A. The second end of the open stub 12 is a circular arc of the fan and is opened. Forming the open stub 12 in the substantially fan shape makes the impedance of the open stub 12 high at the first end side and makes the impedance of the open stub 12 lower as the distance to the second end side (open) is decreased. This enables the frequency domain (bandwidth) to be attenuated to be broadened. Accordingly, setting the length dimension of the open stub 12 to the electrical length equal to ¼ of the wavelength of a specified frequency domain higher than or equal to about 1 GHz makes the attenuation band of the open stub 12 higher than the attenuation band of the inductor 5.

As described above, the power supply circuit board 11 according to the second embodiment, which is configured in the above manner, is capable of attenuating the noise in the broad band from the band of less than about 1 GHz to the band of not less than about 1 GHz. The open stub 12 is formed of the substantially fan-shaped wiring pattern in the second embodiment. Accordingly, it is possible to broaden the attenuation band of the noise with the open stub 12, compared with the case in which the open stub is formed in a substantially linear shape.

The open stub 12 is formed in the substantially fan shape the width dimension of which is continuously increased from the first end to the second end in the second embodiment. However, the present disclosure is not limited to this and the open stub may be formed in a substantially stepwise shape the width dimension of which is increased stepwise from the first end to the second end. In addition, the single substantially fan-shaped open stub 12 may not necessarily be provided and multiple open stubs 12 may be provided on the substrate.

A third embodiment of the present disclosure will now be described with reference to FIG. 7 and FIG. 8. The third embodiment is characterized in that an open stub is formed of a wiring pattern capacitively coupled to the first line. The same reference numerals are used in the third embodiment to identify the same components as those in the first embodiment and a description of such components is omitted herein.

Figure 7:
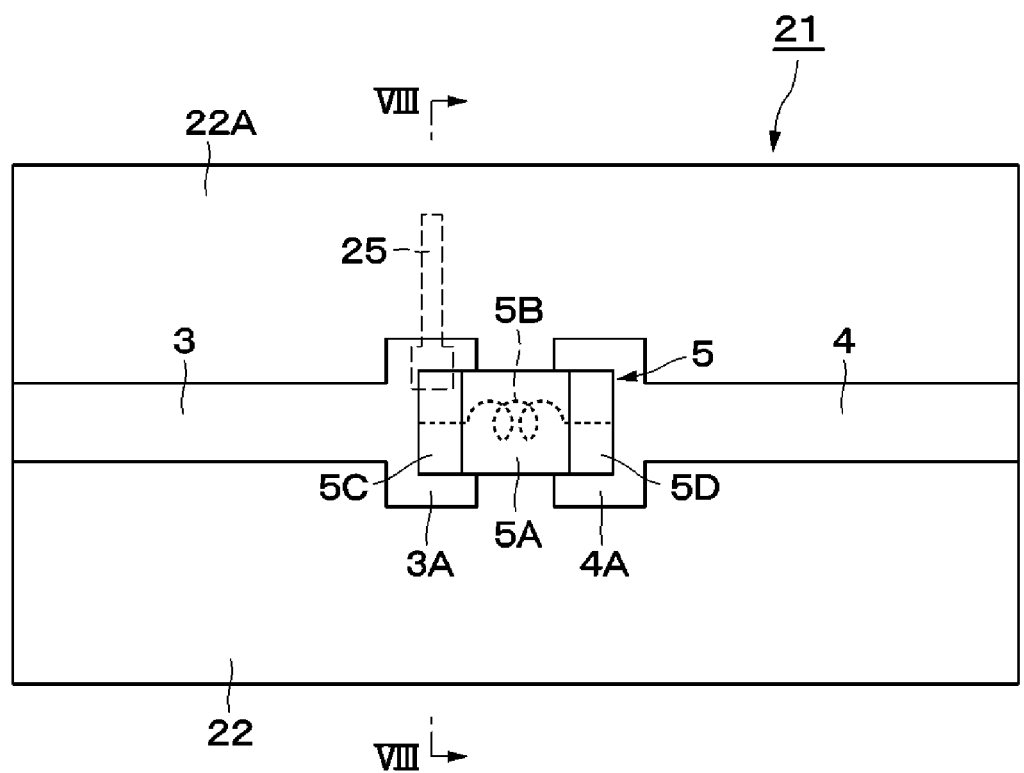
FIG. 7 is a plan view illustrating a power supply circuit board according to a third embodiment of the present disclosure.
Figure 8:
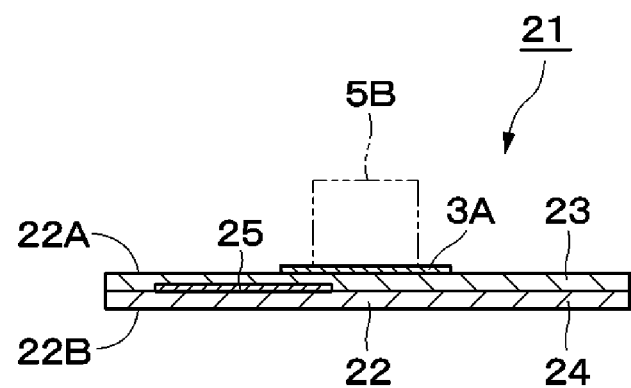
FIG. 8 is a cross-sectional view illustrating the power supply circuit board taken along the VIII-VIII line in FIG. 7.

FIG. 7 and FIG. 8 illustrate a power supply circuit board 21 according to the third embodiment of the present disclosure. The power supply circuit board 21 includes a substrate 22, the first line 3, the second line 4, the inductor 5, and an open stub 25.

As illustrated in FIG. 8, the substrate 22 is a multilayer substrate in which multiple insulating layers 23 and 24 are laminated. The insulating layers 23 and 24 are made of an insulating material, such as a resin material or a ceramic material. The substrate 22 has a first main surface 22A and a second main surface 22B, which are opposed to each other. The first line 3 and the second line 4 are formed on the first main surface 22A of the substrate 22. The inductor 5 is mounted on the first main surface 22A of the substrate 22 in a state in which the inductor 5 is connected to the first line 3 and the second line 4.

The open stub 25 is positioned between the insulating layer 23 and the insulating layer 24 to be formed in the substrate 22. The open stub 25 is formed of a substantially linear-shape wiring pattern. The first end of the open stub 25 is positioned at a position opposed to the land 3A. Specifically, the first end portion of the open stub 25 is opposed to the land 3A of the first line 3 with the insulating layer 23 interposed therebetween. The first end portion of the open stub 25 is capacitively coupled to the first line 3. The second end of the open stub 25 is opened. Capacitively coupling the first line 3 to the open stub 25 so as to be opposed in the laminating direction in the above manner causes the open stub 25 to be connected to the land 3A with no via. In addition, providing the capacitance between the open stub 25 and the land 3A enables the frequency band to be attenuated to be narrowed. Accordingly, setting the length dimension of the open stub 25 to the electrical length equal to ¼ of the wavelength of a specified frequency domain higher than or equal to about 1 GHz makes the attenuation band of the open stub 25 higher than the attenuation band of the inductor 5.

As described above, the power supply circuit board 21 according to the third embodiment, which is configured in the above manner, is capable of attenuating the noise in the broad band from the band of less than about 1 GHz to the band of not less than about 1 GHz. The open stub 25 is formed of the wiring pattern capacitively coupled to the first line 3 in the third embodiment. Accordingly, for example, when low-frequency electric power is supplied through the first line 3, the open stub 25 is capable of attenuating the high-frequency noise with no influence on the electric power supplied through the first line 3.

The single open stub 25 may not necessarily be provided and multiple open stubs 25 may be provided on the substrate in the third embodiment.

The power supply circuit boards 1, 11, and 21, which supply the electric power, are exemplified as the circuit boards in the first to third embodiments, respectively. The present disclosure is not limited to these and the circuit board may be, for example, a signal circuit board that transmits a low-frequency signal.

Figure 9:
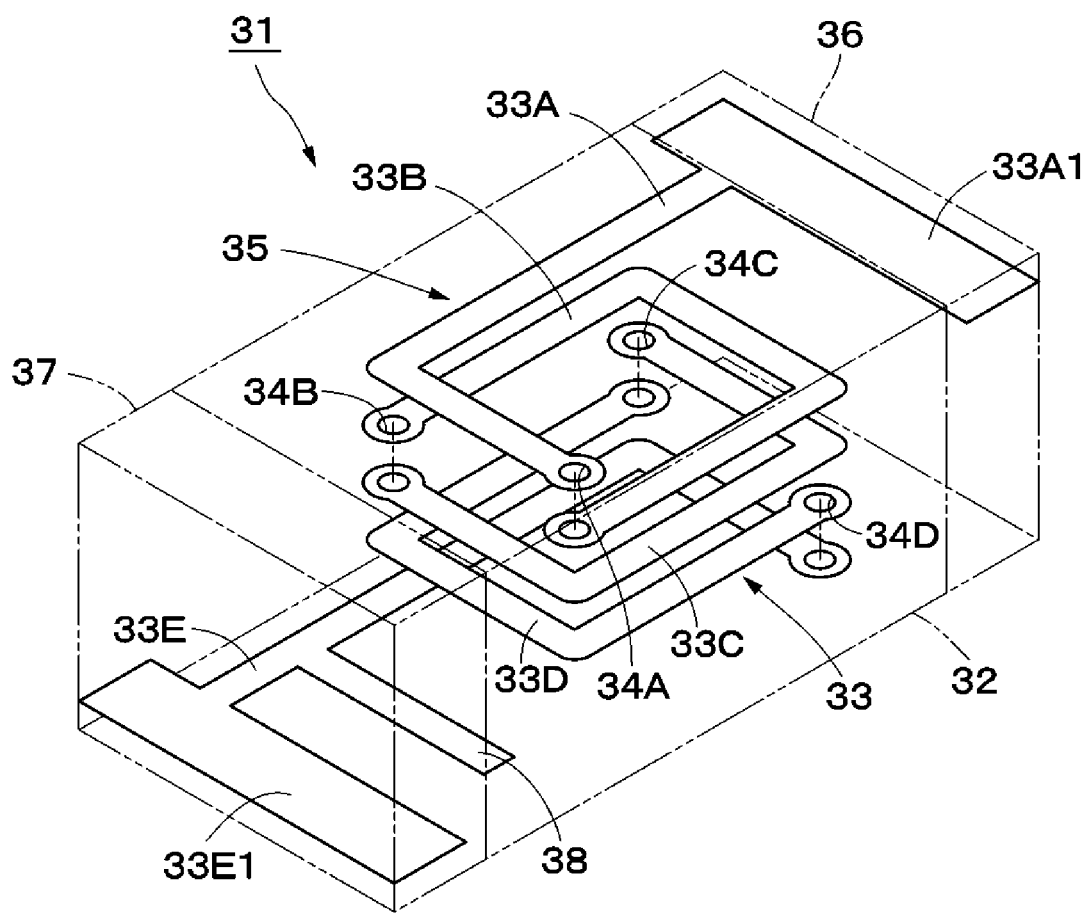
FIG. 9 is a perspective view illustrating an inductor according to a fourth embodiment of the present disclosure.

A fourth embodiment of the present disclosure will now be described with reference to FIG. 9 and FIG. 10. The fourth embodiment is characterized in that an inductor includes an open stub.

An inductor 31 according to the fourth embodiment includes a main body 32, a line 33, a first outer electrode 36, a second outer electrode 37, and an open stub 38.

Figure 10:
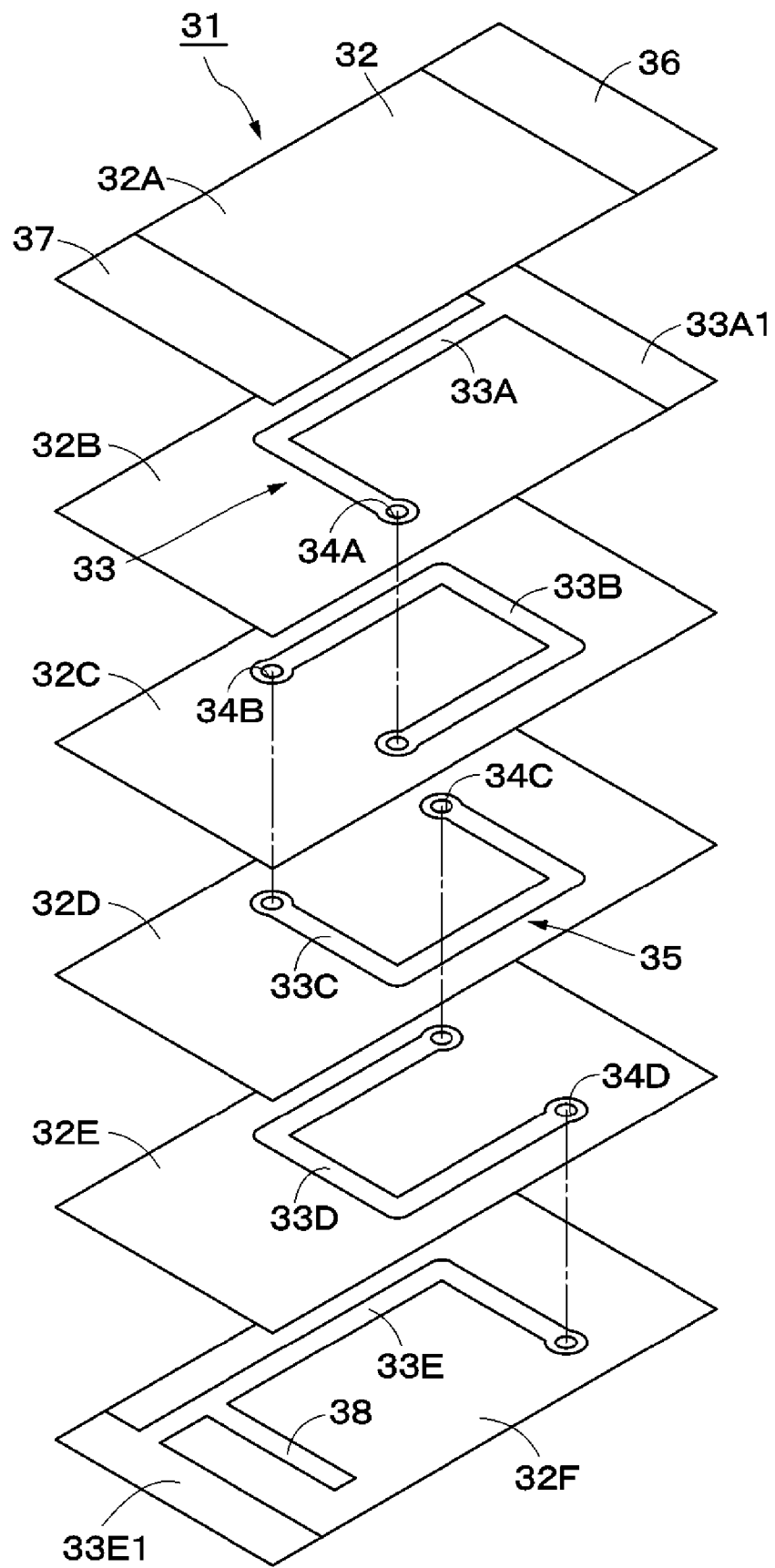
FIG. 10 is an exploded perspective view illustrating the inductor in FIG. 9.

As illustrated in FIG. 10, the main body 32 is made of a ferrite material, which is an insulating material and a magnetic material. Specifically, the main body 32 is formed in a substantially rectangular parallelepiped shape by laminating multiple (for example, six) ferrite sheets 32A to 32F. The ferrite sheet 32A is positioned on a top layer to form a top surface of the main body 32. The ferrite sheet 32F is positioned on a bottom layer to form a bottom surface of the main body 32.

The line 33 is provided in the main body 32. The line 33 is made of, for example, a conductive metal material, which is a conductive material. The line 33 is formed in a substantially elongated strip shape. The line 33 is formed in a substantially spiral shape toward the thickness direction of the main body 32 to form a coil 35. The line 33 includes multiple coil patterns 33A to 33E formed in, for example, substantially L shapes or substantially U shapes and multiple vias 34A to 34D with which the coil patterns 33A to 33E are connected.

The coil pattern 33A is arranged between the ferrite sheet 32A and the ferrite sheet 32B. The coil pattern 33B is arranged between the ferrite sheet 32B and the ferrite sheet 32C. The coil pattern 33C is arranged between the ferrite sheet 32C and the ferrite sheet 32D. The coil pattern 33D is arranged between the ferrite sheet 32D and the ferrite sheet 32E. The coil pattern 33E is arranged between the ferrite sheet 32E and the ferrite sheet 32F.

The second end of the coil pattern 33A is connected to the first end of the coil pattern 33B with the via 34A passing through the ferrite sheet 32B. The second end of the coil pattern 33B is connected to the first end of the coil pattern 33C with the via 34B passing through the ferrite sheet 32C. The second end of the coil pattern 33C is connected to the first end of the coil pattern 33D with the via 34C passing through the ferrite sheet 32D. The second end of the coil pattern 33D is connected to the first end of the coil pattern 33E with the via 34D passing through the ferrite sheet 32E.

The first end portion of the coil pattern 33A is positioned at the first end portion side in the length direction of the main body 32 to serve as the first end portion of the line 33. The first end portion of the coil pattern 33A serves as an electrode connection portion 33A1 having the entire width dimension of the main body 32. The second end portion of the coil pattern 33E is positioned at the second end portion side in the length direction of the main body 32 to serve as the second end portion of the line 33. The second end portion of the coil pattern 33E serves as an electrode connection portion 33E1 having the entire width dimension of the main body 32.

The first outer electrode 36 is provided on the main body 32 and is connected to the first end portion of the line 33 (the electrode connection portion 33A1). The first outer electrode 36 is made of, for example, a conductive metal material, which is a conductive material. The first outer electrode 36 is arranged at the first end portion side in the length direction of the main body 32.

The second outer electrode 37 is provided on the main body 32 and is connected to the second end portion of the line 33 (the electrode connection portion 33E1). The second outer electrode 37 is made of, for example, a conductive metal material, which is a conductive material. The second outer electrode 37 is arranged at the second end portion side in the length direction of the main body 32. The first outer electrode 36 and the second outer electrode 37 are arranged so as to be apart from each other and a gap is formed between the first outer electrode 36 and the second outer electrode 37.

The open stub 38 is positioned in the main body 32 and is connected to the line 33. The open stub 38 is positioned at a portion different from that of the coil 35 in the main body 32. Specifically, the open stub 38 is positioned between the electrode connection portion 33E1 and coil 35 in a plan view of the coil pattern 33E. The open stub 38 is connected to the middle of the coil pattern 33E. The open stub 38 is formed with the coil pattern 33E to be arranged between the ferrite sheet 32E and the ferrite sheet 32F. The open stub 38 is made of the same conductive material as that of the line 33.

The open stub 38 is formed of a substantially linear-shape wiring pattern. The open stub 38 extends in the width direction of the main body 32. The first end of the open stub 38 is connected to the coil pattern 33E. The second end (the end edge) of the open stub 38 is opened. The length dimension of the open stub 38 is set so that the electrical length of the open stub 38 has a value, for example, ¼ of the wavelength of about 2.4 GHz, which is in the radio frequency band. With this configuration, the open stub 38 attenuates the noise in a frequency band around about 2.4 GHz.

The inductor 31 functions as the ferrite beads and is equivalent to resistance in a high-frequency domain. The attenuation band of the open stub 38 is made higher than the attenuation band of the inductor 31 made of the ferrite material. As a result, the inductor 31 is capable of attenuating the noise in the broad band from the band of less than about 1 GHz to the band of not less than about 1 GHz.

As described above, according to the fourth embodiment configured in the above manner, the noise in the band of less than about 1 GHz is capable of being attenuated with the transmission loss in the inductor 31 made of the ferrite material. In addition, the noise in the band of not less than about 1 GHz is capable of being attenuated with the open stub 38. Accordingly, the inductor 31 is capable of attenuating the noise in the broad band from the band of less than about 1 GHz to the band of not less than about 1 GHz. The inductor 31 includes the open stub 38 incorporated in the main body 32 in the fourth embodiment. Accordingly, it is not necessary to provide the open stub on the circuit board, unlike the first embodiment, and the noise in the broad band is capable of being attenuated using the inductor 31. In addition, when the permittivity of the main body 32 is higher than the permittivity of the circuit board, the length dimension of the open stub 38 may be decreased. The open stub 38 and the coil pattern 33E and so on may be arranged so as to be opposed to each other to include the configuration illustrated in FIG. 7 in a chip inductor although not illustrated in the fourth embodiment.

A fifth embodiment of the present disclosure will now be described with reference to FIG. 11. The fifth embodiment is characterized in that an open stub is formed of a via provided in the main body. The same reference numerals are used in the fifth embodiment to identify the same components as those in the fourth embodiment and a description of such components is omitted herein.

Figure 11:
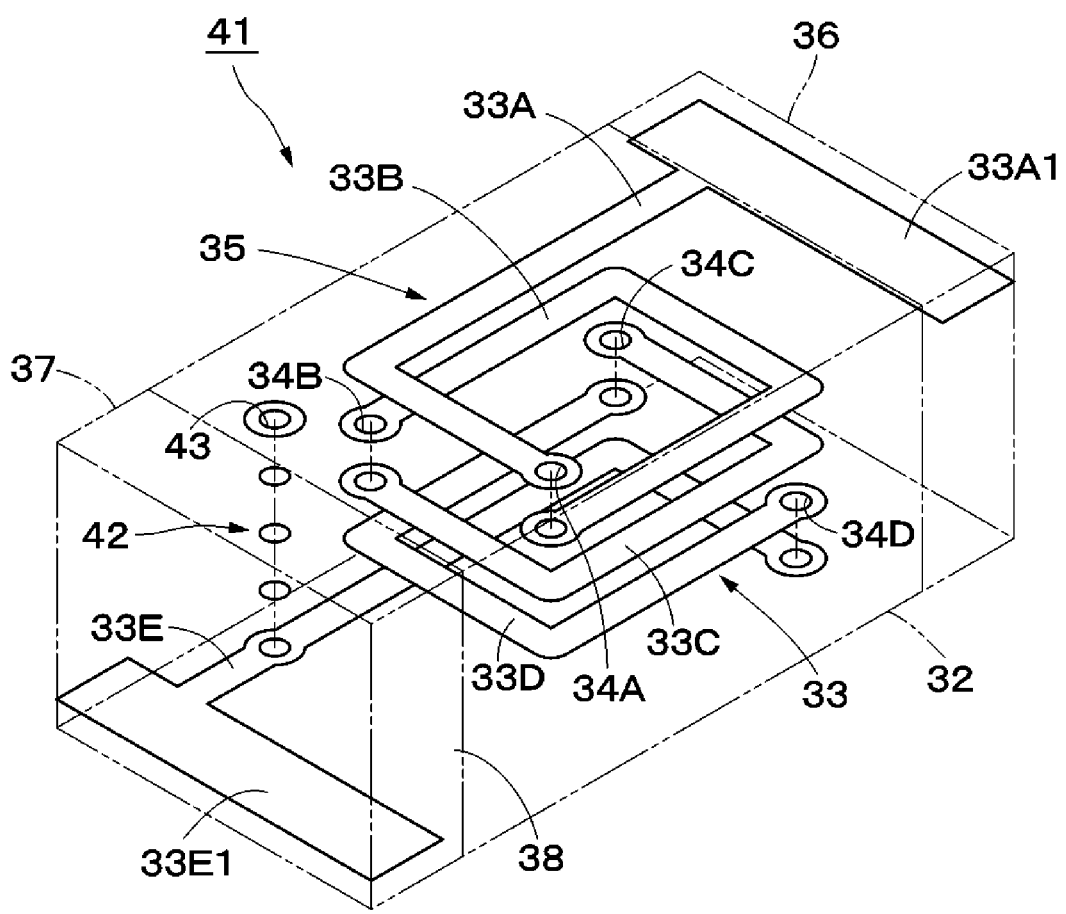
FIG. 11 is a perspective view illustrating an inductor according to a fifth embodiment of the present disclosure.

FIG. 11 illustrates an inductor 41 according to the fifth embodiment of the present disclosure. The inductor 41 according to the fifth embodiment includes the main body 32, the line 33, the first outer electrode 36, the second outer electrode 37, and an open stub 42.

The open stub 42 is connected to the coil pattern 33E of the line 33. The open stub 42 is formed of a via 43 passing through the ferrite sheets 32B to 32E. The open stub 42 is formed in a linear pattern along the thickness direction of the main body 32. The first end of the open stub 42 is connected to the coil pattern 33E. The second end of the open stub 42 is opened. Accordingly, setting the length dimension of the open stub 42 to the electrical length equal to ¼ of the wavelength of a specified frequency domain higher than or equal to about 1 GHz enables the open stub 42 to attenuate the frequency domain of not less than about 1 GHz. Consequently, the attenuation band of the open stub 42 is made higher the attenuation band of the ferrite material.

As described above, the inductor 41 according to the fifth embodiment, which is configured in the above manner, is capable of attenuating the noise in the broad band from the band of less than about 1 GHz to the band of not less than about 1 GHz. The open stub 42 is formed of the via 43 in the fifth embodiment. Accordingly, adjusting the depth dimension of the via 43 enables the center frequency of the attenuation band of the noise with the open stub 42 to be set to a desired value.

A sixth embodiment of the present disclosure will now be described with reference to FIG. 12 and FIG. 13. The sixth embodiment is characterized in that an open stub is formed in a meander pattern. The same reference numerals are used in the sixth embodiment to identify the same components as those in the fourth embodiment and a description of such components is omitted herein.

Figure 12:
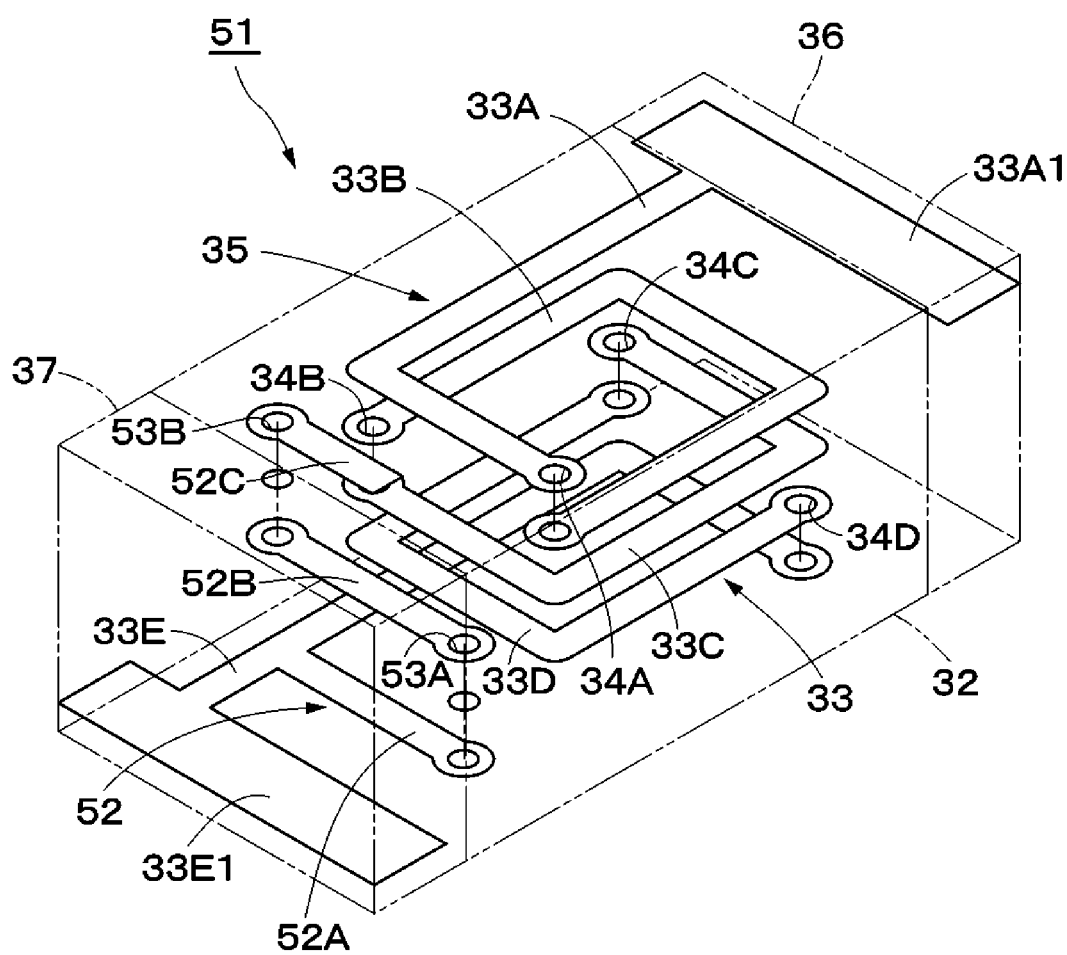
FIG. 12 is a perspective view illustrating an inductor according to a sixth embodiment of the present disclosure.
Figure 13:
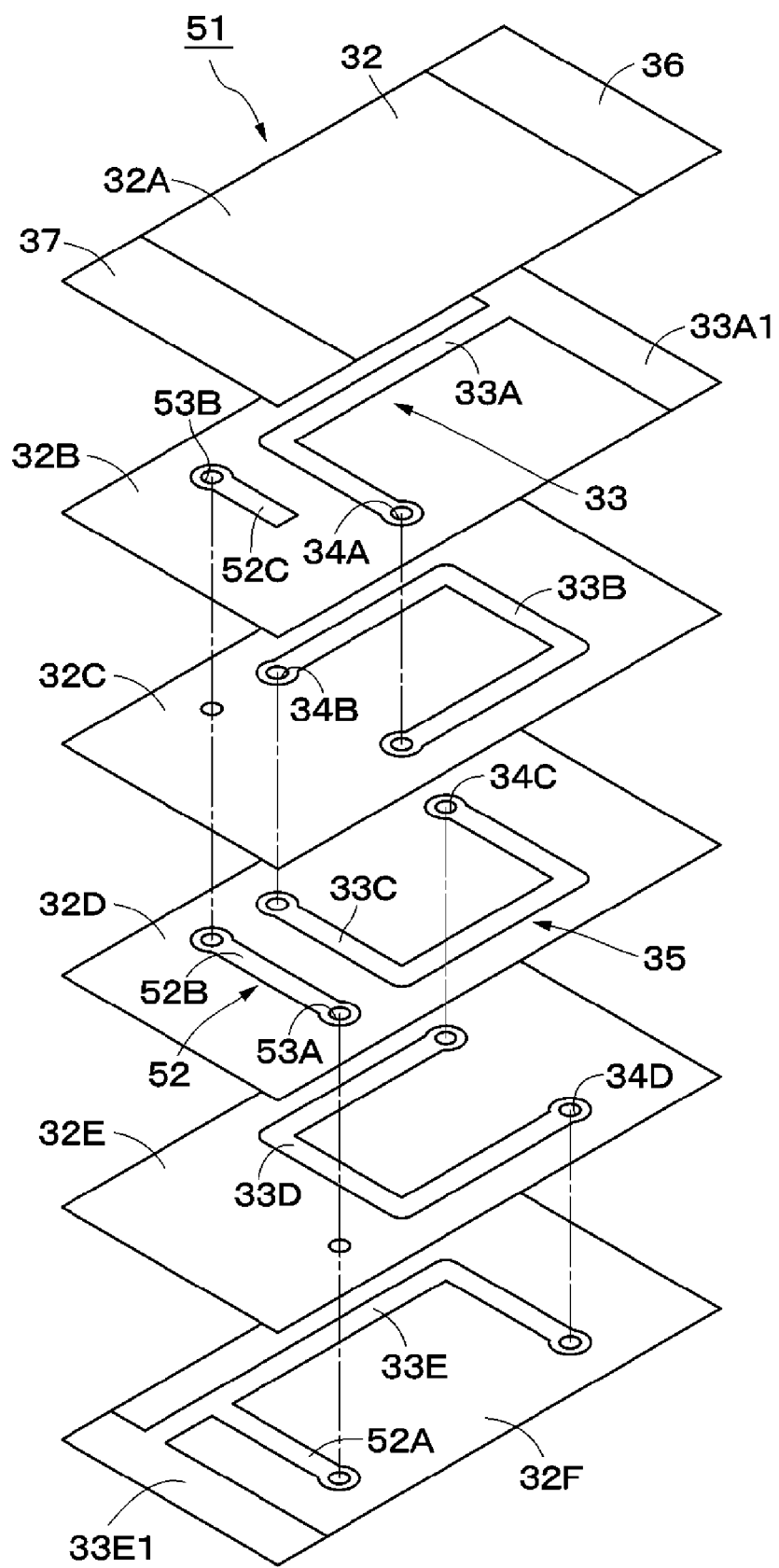
FIG. 13 is an exploded perspective view illustrating the inductor in FIG. 12.

FIG. 12 and FIG. 13 illustrate an inductor 51 according to the sixth embodiment of the present disclosure. The inductor 51 according to the sixth embodiment includes the main body 32, the line 33, the first outer electrode 36, the second outer electrode 37, and an open stub 52.

The open stub 52 is connected to the coil pattern 33E of the line 33. The open stub 52 is formed in a meander pattern reciprocating in the width direction of the main body 32. Specifically, the open stub 52 is formed by connecting three wiring patterns 52A, 52B, and 52C extending in the width direction of the main body 32 with vias 53A and 53B.

As illustrated in FIG. 13, the wiring pattern 52A is arranged between the ferrite sheet 32E and the ferrite sheet 32F with the coil pattern 33E. The wiring pattern 52B is arranged between the ferrite sheet 32C and the ferrite sheet 32D. The wiring pattern 52C is arranged between the ferrite sheet 32A and the ferrite sheet 32B.

The first end of the wiring pattern 52A is connected to the coil pattern 33E. The second end of the wiring pattern 52A is connected to the first end of the wiring pattern 52B with the via 53A passing through the ferrite sheets 32D and 32E. The second end of the wiring pattern 52B is connected to the first end of the wiring pattern 52C with the via 53B passing through the ferrite sheets 32B and 32C. The second end of the wiring pattern 52C is opened.

In the above configuration, the first end of the open stub 52 is connected to the coil pattern 33E. The second end of the open stub 52 is opened. Accordingly, setting the length dimension of the open stub 52 to the electrical length equal to ¼ of the wavelength of a specified frequency domain higher than or equal to about 1 GHz makes the attenuation band of the open stub 52 higher than the attenuation band of the ferrite material.

As described above, the inductor 51 according to the sixth embodiment, which is configured in the above manner, is capable of attenuating the noise in the broad band from the band of less than about 1 GHz to the band of not less than about 1 GHz. The open stub 52 is formed in the meander pattern in the sixth embodiment. Accordingly, even when the length dimension of the open stub 52 is greater than the width dimension or the height dimension of the main body 32, it is possible to arrange the open stub 52 inside the main body 32.

A seventh embodiment of the present disclosure will now be described with reference to FIG. 14. The seventh embodiment is characterized in that an open stub is formed of a substantially fan-shaped wiring pattern. The same reference numerals are used in the seventh embodiment to identify the same components as those in the fourth embodiment and a description of such components is omitted herein.

Figure 14:
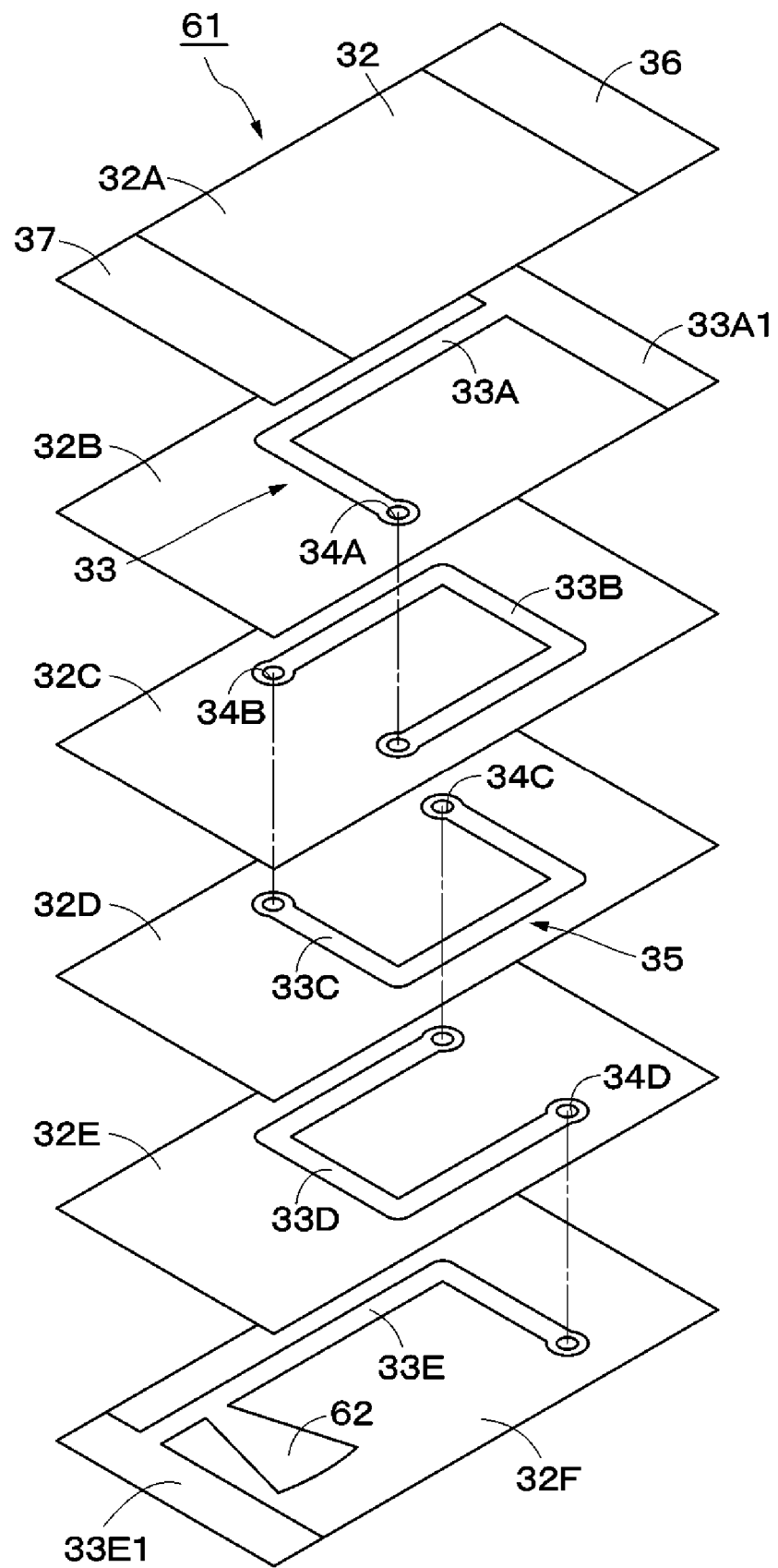
FIG. 14 is an exploded perspective view illustrating an inductor according to a seventh embodiment of the present disclosure.

FIG. 14 illustrates an inductor 61 according to the seventh embodiment of the present disclosure. The inductor 61 according to the seventh embodiment includes the main body 32, the line 33, the first outer electrode 36, the second outer electrode 37, and an open stub 62.

The open stub 62 is connected to the coil pattern 33E of the line 33. The open stub 62 is arranged between the ferrite sheet 32E and the ferrite sheet 32F. The open stub 62 is formed of the substantially fan-shaped wiring pattern. The first end of the open stub 62 is the pivot of the fan and is connected to the coil pattern 33E. The second end of the open stub 62 is a circular arc of the fan and is opened. Accordingly, setting the length dimension of the open stub 62 to the electrical length equal to ¼ of the wavelength of a specified frequency domain higher than or equal to about 1 GHz makes the attenuation band of the open stub 62 higher than the attenuation band of the ferrite material.

As described above, the inductor 61 according to the seventh embodiment, which is configured in the above manner, is capable of attenuating the noise in the broad band from the band of less than about 1 GHz to the band of not less than about 1 GHz. The open stub 62 is formed of the substantially fan-shaped wiring pattern in the seventh embodiment. Accordingly, forming the open stub 62 in the substantially fan shape makes the impedance of the open stub 62 high at the first end side and makes the impedance of the open stub 62 lower as the distance to the second end is decreased. This enables the frequency domain (bandwidth) to be attenuated to be broadened. Consequently, setting the length dimension of the open stub 62 to the electrical length equal to ¼ of the wavelength of a specified frequency domain higher than or equal to about 1 GHz makes the attenuation band of the open stub 62 higher than the attenuation band of the ferrite material.

The open stub 62 is formed in the substantially fan shape the width dimension of which is continuously increased from the first end to the second end in the seventh embodiment. However, the present disclosure is not limited to this and the open stub may be formed in a substantially stepwise shape the width dimension of which is increased stepwise from the first end to the second end.

The case is exemplified in the seventh embodiment in which the open stub 62 is connected to the coil pattern 33E. The present disclosure is not limited to this and, for example, the open stub may be connected to the coil pattern 33A. Alternatively, the open stub may be connected an intermediate position of the coil patterns 33A to 33E composing the coil 35. This configuration is applicable to the fourth to sixth embodiments.

The case is exemplified in the fourth to seventh embodiments in which the line 33 composes the spiral coil 35. The present disclosure is not limited to this and, for example, the line may be positioned in the main body 32 to be formed in a linear pattern or a meander pattern.

Figure 15:
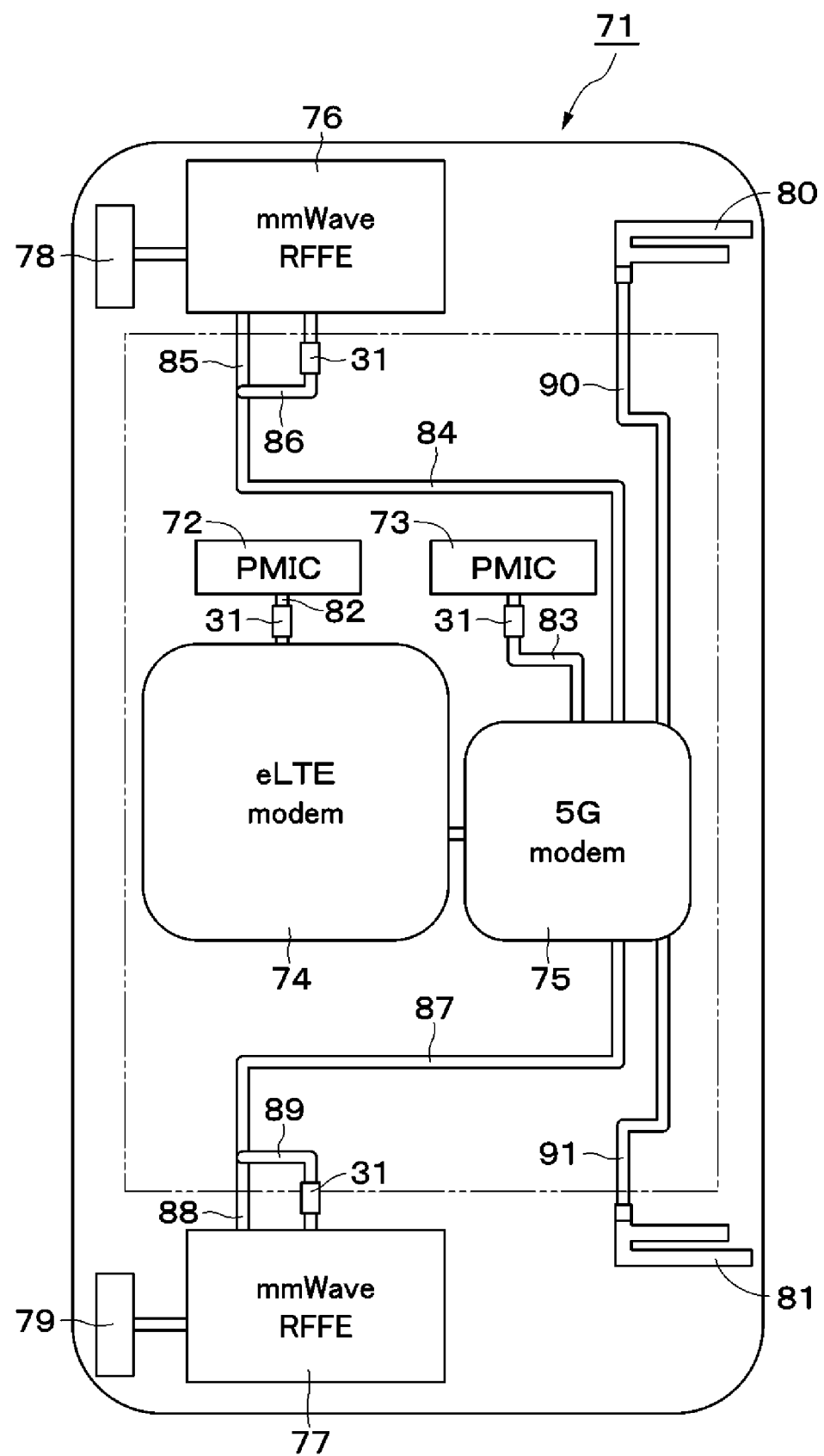
FIG. 15 is a front view illustrating a communication apparatus according to an eighth embodiment of the present disclosure.

An eighth embodiment of the present disclosure will now be described with reference to FIG. 15. The eighth embodiment is characterized in that the inductors with the open stubs are applied to a communication apparatus serving as the radio apparatus. The same reference numerals are used in the eighth embodiment to identify the same components as those in the fourth embodiment and a description of such components is omitted herein.

A communication apparatus 71 according to the eight embodiment includes multiple power module integrated circuits 72 and 73 (hereinafter referred to as PMICs 72 and 73) that supply driving power, an eLTE modem 74, a 5G modem 75, radio-frequency frond ends 76 and 77 for millimeter waves (hereinafter referred to as RFFEs 76 and 77), and antennas 78 to 81. The PMICs 72 and 73 may be composed of one IC.

The PMIC 72 is connected to the eLTE modem 74 via a power line 82. The PMIC 73 is connected to the 5G modem 75 via a power line 83. A common line 84 through which both power and a signal are transmitted is connected to the 5G modem 75. The leading end of the common line 84 is branched into a signal line 85 and a power line 86. The signal line 85 and the power line 86 are connected to the RFFE 76. The RFFE 76 is connected to the antenna 78.

A common line 87 through which both power and a signal are transmitted is connected to the 5G modem 75. The leading end of the common line 87 is branched into a signal line 88 and a power line 89. The signal line 88 and the power line 89 are connected to the RFFE 77. The RFFE 77 is connected to the antenna 79. The antennas 80 and 81 are connected to the 5G modem 75 via signal lines 90 and 91, respectively. The inductor 31 according to the fourth embodiment is connected to the middle of each of the power lines 82, 83, 86, and 89.

As described above, in the eighth embodiment configured in the above manner, the inductors 31 are capable of attenuating the noise in the broad band from the band of less than about 1 GHz to the band of not less than about 1 GHz. The inductor 31 is connected to the middle of each of the power lines 82, 83, 86, and 89 in the eighth embodiment. Accordingly, even when the noise in a communication frequency band (for example, several gigahertz) is mixed into the power lines 82, 83, 86, and 89 along with the use of the communication apparatus 71, the noise is capable of being attenuated with the inductors 31.

The case is exemplified in the eighth embodiment in which the inductor 31 according to the fourth embodiment is applied to the communication apparatus 71. The present disclosure is not limited to this and any of the inductors 41, 51, and 61 according to the fifth to the seventh embodiments, respectively, may be applied to the communication apparatus. Any of the power supply circuit board 1, 11, and 21 according to the first to third embodiments, respectively, may be applied to the communication apparatus or the power supply circuit board 10 according to the modification may be applied to the communication apparatus.

The communication apparatus 71 is exemplified as the radio apparatus in the eighth embodiment. The present disclosure is not limited to this and the circuit boards and the inductors according to the embodiments of the present disclosure may be applied to, for example, a radar apparatus serving as the radio apparatus.

The embodiments described above are only examples and partial replacement or combination of the components described in different embodiments is also available.

The disclosure included in the embodiments described above will now be described. A circuit board includes a substrate, a first line that is provided on a first main surface of the substrate and that has a land, a second line that is provided on the first main surface of the substrate and that has a land, an inductor that is connected to the land of the first line and the land of the second line and that is made of a ferrite material, and an open stub that is connected to at least one of the first line and the second line.

With the above configuration, when noise is transmitted to the first line and the second line, the noise in the band of less than about 1 GHz is capable of being attenuated with the transmission loss in the inductor. In addition, the noise in the band of not less than about 1 GHz is capable of being attenuated with the open stub. Accordingly, the circuit board is capable of attenuating the noise in the broad band from the band of less than about 1 GHz to the band of not less than about 1 GHz.

In the present disclosure, the open stub may be connected to the land of one of the first line and the second line. With this configuration, the noise in a high-frequency band is capable of being attenuated with the open stub connected to the land.

In the present disclosure, the open stub may be formed of a substantially linear-shape wiring pattern. Accordingly, adjusting the length dimension of the open stub enables the center frequency of the attenuation band of the noise with the open stub to be set to a desired value.

In the present disclosure, the open stub may be formed of a substantially fan-shaped wiring pattern or a stepwise wiring pattern. Accordingly, it is possible to broaden the attenuation band of the noise with the open stub, compared with the case in which the open stub is formed in a substantially linear shape.

In the present disclosure, the open stub may be formed of a wiring pattern capacitively coupled to one of the first line and the second line. Accordingly, for example, when low-frequency electric power is supplied through the first line and the second line, the open stub is capable of attenuating the high-frequency noise with no influence on the electric power supplied through the first line and the second line.

In the present disclosure, one of the first line and the second line may be opposed to and may be capacitively coupled to the wiring pattern of the open stub. With this configuration, it is not necessary to connect the first line or the second line to the wiring pattern of the open stub with any via.

In the present disclosure, an attenuation band of the open stub may be higher than an attenuation band of the inductor. Accordingly, the noise in the band not higher than about 1 GHz is capable of being attenuated with the inductor. The noise in the band of not less than about 1 GHz is capable of being attenuated with the open stub.

In the present disclosure, an attenuation band of the open stub may at least include a frequency of not less than about 2.4 GHz. Accordingly, even when the noise near about 2.4 GHz, which is in the radio frequency band, is mixed into the line of the inductor, the noise is capable of being attenuated with the open stub in the circuit board.

An inductor includes a main body made of a ferrite material, a line provided in the main body, a first outer electrode that is provided on the main body and that is connected to a first end portion of the line, a second outer electrode that is provided on the main body and that is connected to a second end portion of the line, and an open stub that is positioned in the main body and that is connected to the line.

With the above configuration, when noise is transmitted to the line, the noise in the band of less than about 1 GHz is capable of being attenuated with the transmission loss in the inductor made of the ferrite material. In addition, the noise in the band of not less than about 1 GHz is capable of being attenuated with the open stub. Accordingly, the inductor is capable of attenuating the noise in the broad band from the band of less than about 1 GHz to the band of not less than about 1 GHz.

In the present disclosure, the open stub may be formed of a via provided in the main body. Accordingly, adjusting the depth dimension of the via enables the center frequency of the attenuation band of the noise with the open stub to be set to a desired value.

In the present disclosure, the open stub may be formed in a meander pattern. Accordingly, even when the length dimension of the open stub is greater than the width dimension or the height dimension of the main body, it is possible to arrange the open stub inside the main body.

In the present disclosure, the open stub may be formed of a substantially fan-shaped wiring pattern or a stepwise wiring pattern. Accordingly, it is possible to broaden the attenuation band of the noise with the open stub, compared with the case in which the open stub is formed in a substantially linear shape.

In the present disclosure, an attenuation band of the open stub may be higher than an attenuation band of the ferrite material. Accordingly, the noise in the band of less than about 1 GHz is capable of being attenuated with the transmission loss in the inductor made of the ferrite material. In addition, the noise in the band of not less than about 1 GHz is capable of being attenuated with the open stub.

In the present disclosure, an attenuation band of the open stub may at least include a frequency of not less than about 2.4 GHz. Accordingly, even when the noise near about 2.4 GHz, which is in the radio frequency band, is mixed into the line of the inductor, the noise is capable of being attenuated with the open stub in the inductor.

A radio apparatus including the circuit board or the inductor is also configured.

While preferred embodiments of the disclosure have been described above, it is to be understood that variations and modifications will be apparent to those skilled in the art without departing from the scope and spirit of the disclosure.

The scope of the disclosure, therefore, is to be determined solely by the following claims.

What is claimed is:

1. An inductor comprising:
   a main body made of a ferrite material;
   a line provided in the main body;
   a first outer electrode that is provided on the main body and that is connected to a first end portion of the line;
   a second outer electrode that is provided on the main body and that is connected to a second end portion of the line; and
   an open stub that is positioned in the main body and that is connected to the line, wherein
   the line is a coil, and
   the open stub is positioned at a portion different than that of the coil in the main body.

2. The inductor according to claim 1, wherein
   the open stub is configured as a via provided in the main body.

3. The inductor according to claim 2, wherein
   an attenuation band of the open stub is higher than an attenuation band of the ferrite material.

4. The inductor according to claim 2, wherein
   an attenuation band of the open stub at least includes a frequency of not less than about 2.4 GHz.

5. The inductor according to claim 1, wherein
   the open stub is configured in a meander pattern.

6. The inductor according to claim 1, wherein
   the open stub is configured as a substantially fan-shaped wiring pattern or a stepwise wiring pattern.

7. The inductor according to claim 1, wherein
   an attenuation band of the open stub is higher than an attenuation band of the ferrite material.

8. The inductor according to claim 1, wherein
   an attenuation band of the open stub at least includes a frequency of not less than about 2.4 GHz.

9. A radio apparatus comprising the inductor according to claim 1.

* * * * *